United States Patent
Son et al.

[19]

[11] Patent Number: 5,959,924
[45] Date of Patent: Sep. 28, 1999

[54] METHOD AND CIRCUIT FOR CONTROLLING AN ISOLATION GATE IN A SEMICONDUCTOR MEMORY DEVICE

[75] Inventors: Moon-hae Son; Choong-sun Shin; Jin-man Han, all of Seoul, Rep. of Korea

[73] Assignee: Samsung Electronics, Co., Ltd., Suwon, Rep. of Korea

[21] Appl. No.: 09/019,520

[22] Filed: Feb. 5, 1998

[30] Foreign Application Priority Data

Feb. 5, 1997 [KR] Rep. of Korea .......................... 97-3578

[51] Int. Cl.$^6$ ........................................................ G11C 7/00
[52] U.S. Cl. ................ 365/222; 365/230.03; 365/230.06; 365/230.08
[58] Field of Search ..................... 365/222, 230.03, 365/230.06, 230.08

[56] References Cited

U.S. PATENT DOCUMENTS

| | | | |
|---|---|---|---|
| 5,251,176 | 10/1993 | Komatsu | 365/222 |
| 5,798,976 | 8/1998 | Arimoto | 365/222 |
| 5,822,264 | 10/1998 | Tomishima et al. | 365/222 |
| 5,831,921 | 11/1998 | Tsukude | 365/222 |
| 5,831,924 | 11/1998 | Nitta et al. | 365/230.03 |
| 5,835,436 | 11/1998 | Ooishi | 365/230.03 |
| 5,835,441 | 11/1998 | Seyyedy et al. | 365/230.06 |
| 5,844,849 | 12/1998 | Furutani | 365/230.08 |

*Primary Examiner*—David Nelms
*Assistant Examiner*—Gene N. Auduong
*Attorney, Agent, or Firm*—Marger Johnson & McCollom, P.C.

[57] ABSTRACT

A method of controlling an isolation gate of a semiconductor memory device and a circuit therefor are disclosed. The method includes the steps of generating a refresh row active signal, generating a plurality of block select signals, generating a latch isolation control signal and controlling an isolation gate. The refresh row active signal is activated for a constant period. A plurality of block select signals are selectively activated when the refresh row active signal is active. The latch isolation control signal is set according to a block select signal and reset by an adjacent block select signal related to the other isolation gate connected to the same bit line sense amplifier of the block. In the step of controlling the isolation gate, when the latch isolation control signal is active, the isolation gates are turned on, and the other isolation gates connected to the same bit line sense amplifier are turned off. The isolation gate control circuit includes a plurality of latches, a plurality of block select signal drivers and a plurality of isolation gate control signal generators.

12 Claims, 6 Drawing Sheets

METHOD AND CIRCUIT FOR CONTROLLING AN ISOLATION GATE IN A SEMICONDUCTOR MEMORY DEVICE

BACKGROUND OF THE INVENTION

1. Field of the Invention

The present invention relates to a semiconductor memory device and a method for controlling isolation gates, and more particularly during a self-refresh operation of a semiconductor memory device, such having the structure of a shared bit line sense amplifier.

2. Description of the Related Art

A memory cell array of a semiconductor memory device includes one or more banks. Each bank has a plurality of memory blocks, and each memory block includes a plurality of word lines. The memory cells are arranged to form a matrix, one on each of the intersections of a plurality of word lines and a plurality of column lines. Each column line is comprised of a bit line and a complementary bit line.

In general, a volatile semiconductor memory device such as a dynamic random access memory requires a refresh operation at regular intervals in order to prevent the loss of data stored as electric charge.

In a self-refresh mode, the semiconductor memory device selects a word line from a plurality of word lines in each clock period generated by an internal clock oscillator, to perform a refresh operation for refreshing the memory cells connected to the selected word line.

The typical architecture of most semiconductor memory devices such as DRAMs is that the common sense amplifiers are shared between one memory block and an adjacent memory block. When the memory block is selected, a memory cell in the selected memory block should be connected to the common sense amplifier exclusively. Therefore isolation gates are needed between the memory block and common sense amplifiers to prevent unexpected operations in the common sense amplifiers due to an abnormal connection by an unselected memory block. FIG. 1 shows a conventional circuit for controlling an isolation gate of a semiconductor memory device, and related circuits.

Referring to FIG. 1, a semiconductor memory cell array which include four memory blocks 150, 151, 152 and 153 is shown. Each of the memory blocks includes 512 word lines WL0 to W1511. Bit line sense amplifiers 130, 131, 132, 133 and 134 are each shared by the neighboring memory blocks. Isolation gates 140L, 140R, 141L, 141R, 142L, 142R, 143L and 143R are connected respectively between each bit line sense amplifier and the memory blocks corresponding thereto, and perform a switching operation responding to the isolation gate control signals PIS00L, PIS00R, PIS01L, PIS01R, PIS02L, PIS02R, PIS03L and PIS03R, respectively. In the prior art, a control signal directed to isolation gates is only controlled by a block selection signal (BLSi) which is designated to a certain memory block.

Block select signal drivers 120, 121, 122 and 123 buffer block select signals BLK0, BLK1, BLK2 and BLK3, respectively, to generate respective outputs (BLS0, BLS1, BLS2, BLS3). The block select signals BLK0, BLK1, BLK2 and BLK3 are obtained by decoding block information of a row address, and only the block select signal, which refers to a memory block to be accessed, is activated. A refresh operation can be simultaneously performed on the plurality of memory blocks, according to a refresh scheme. At this time, the plurality of block select signals are also simultaneously activated. For example, block information in a semiconductor memory device including four memory blocks, corresponds to 2 bit in row addresses, which are each decoded to generate four block select signals BLK0, BLK1, BLK2 and BLK3. The respective outputs BLS0, BLS1, BLS2 and BLS3 of the block select signal drivers 120, 121, 122 and 123 are applied to isolation gates corresponding to the same memory block and to neighboring isolation gate portions. For example, the output 'BLS0' of the block select signal driver 120 is applied to isolation gate control signal generators 110L and 110R, and also to an isolation gate control signal generator 111L. As another example, the output 'BLS1' of the block select signal driver 121 is applied to isolation gate control signal generators 111L and 111R, and also to isolation gate control signal generators 110R and 112L. Other outputs are also applied in the above-described manner.

In the structure of the memory cell array of FIG. 1, in the case that memory cells of a memory block 150 are accessed, bit line sense amplifiers 130 and 131 must be activated. At this time, the isolation gates 140L and 140R must be turned on, and the isolation gate 141L must be turned off. In the case that memory cells of the memory block 151 are accessed, the bit line sense amplifiers 131 and 132 must be activated. At this time, the isolation gates 141L and 141R must be turned on, and the isolation gates 140R and 142L must be turned off. That is, the bit line sense amplifiers 130 to 134 are each shared by their neighboring memory blocks, so that the isolation gates connected between the accessed memory block and the neighboring bit line sense amplifiers should be turned on, and the isolation gates connected between a memory block not accessed and the neighboring bit line sense amplifiers should be turned off. Accordingly, the isolation gate control signals PIS00L, PIS00R, PIS01L, PIS01R, PIS02L, PIS02R, PIS03L and PIS03R generated by the isolation gate control signal generators 110L, 110R, 111L, 111R, 112L, 112R, 113L and 113R are activated to a boosted voltage VPP in the case that the corresponding block select signals are activated to a 'high' level, and deactivated to a ground voltage VSS in the case that the neighboring block select signals corresponding thereto are activated to a 'high' level.

Operation of the self refresh mode is now described in detail with reference to FIG. 2. When a self refresh order is received from an external source, a self refresh set signal PSELF is activated to a 'high' level, and then the falling edge of a refresh row active signal PRFH triggers the activation of a self refresh mode signal PSRAS to a 'high' level. The refresh low active signal PRFH is generated in a refresh mode, i.e., a self refresh mode or an automatic refresh mode, according to the output POSC of an oscillator, and in a non-refresh mode according to a clock CLK. In the refresh mode, the block select signal is triggered by the refresh row active signal PRFH, to activate to a 'high' level. The block select signals BLK0, BLK1, BLK2 and BLK3 are buffered by block select signal drivers 120, 121, 122 and 123, respectively, of FIG. 1, and then output as block driving signals BLS0, BLS1, BLS2 and BLS3, respectively. The block driving signals are applied to an isolation gate control signal generator to turn it on, and to isolation gate control signal generators corresponding to other isolation gates connected to the same bit line sense amplifier, to turn then off. The isolation gate control signals PIS00L, PIS00R, PIS01L, PIS01R, PIS02L, PIS02R, PIS03L and PIS03R are generated according to block driving signals BLS0, BLS1, BLS2 and BLS3. The isolation gate control signals PIS00L, PIS00R, PIS01L, PIS01R, PIS02L, PIS02R, PIS03L and PIS03R each have three possible levels: a power supply voltage VCC when the memory block corresponding thereto, and the neighboring memory blocks, are not accessed; a boosted voltage level VPP when the memory block corresponding thereto is accessed, and a ground voltage VSS when the neighboring memory block is accessed. At this time, the block driving signal is generated only by buffering the block select signal, so that it has a waveform same as that of the refresh row active signal PRFH. That is, the block driving signal has a pulse waveform periodically activated. Accordingly, the level of each of the isolation gate control signals generated by the block driving signals is changed whenever the refresh row active signal PRFH is activated. This continuous change causes bias variations and thus, detrimentally increases power consumption of the memory device.

In a normal mode, one word line is selected from a plurality of word lines and then accessed according to a row address signal applied from an external source. Therefore, the level of each of the isolation gate control signals is changed according to the low active signal. However, in the self-refresh mode, a plurality of word lines are sequentially accessed, so that the level of each of the isolation gate control signals need not be changed whenever the row active signal PRFH is activated but detrimentally are changed.

In detail, in the self-refresh mode, word lines WL0, WL1 and WL2 of a memory block 151 are sequentially accessed. Accordingly, the isolation gate control signals PIS0 need not change during the period from when the word line WL0 of the memory block 151 is accessed, to when the word line WL511 thereof is accessed.

However, in the conventional isolation gate control circuit of FIG. 1, this characteristic of the refresh operation is disregarded. Therefore, as shown in FIG. 2, levels of the isolation gate control signals PIS00L, PIS00R, PIS01L, PIS01R, PIS02L, PIS02R, PIS03L and PIS03R are unnecessarily changed, which causes excessive power consumption.

SUMMARY OF THE INVENTION

To solve the above problems, it is an object of the present invention to provide a method for controlling an isolation gate of a semiconductor device.

It is another object of the present invention to provide a circuit for controlling an isolation gate of a semiconductor device.

Accordingly, to achieve the above first object in the present invention, the control signal can be controlled more complex than the conventional technology. That is, in the present invention the control signal is latched by means of the block selection signal (BLKi). Also, the latched control signal can be reset or released by an adjacent block selection signal such as BLKj. As a result the control signal directed to isolation gates in the present invention can be slightly varied in its phase compared to the conventional control scheme. Then, power consumption can be reduced, especially in a refresh mode. The de facto quantity of power consumption is a very critical factor in determining the overall function of the semiconductor memory device. The more the bias (forward current) varies on terminals of the transistors/transmission line, the more electrical power consumption increases in proportion to the voltage and the capacitance thereon. Thus, it is beneficial to maintain a current at a fixed value than to vary it.

More particularly, there is provided a method for controlling an isolation gate of a semiconductor memory device including the steps of generating a refresh low active signal, generating a plurality of block select signals, generating a latch isolation control signal, and controlling an isolation gate. The refresh low active signal is activated for a constant period. The plurality of block select signals are selectively activated when the refresh row active signal PRFH is active. The latch isolation control signal is set by the block select signal corresponding thereto and reset by the block select signal for a memory block to be refreshed. In the step of controlling an isolation gate, when the latch isolation control signal is active, the isolation gates corresponding thereto are turned on, and other isolation gates connected to the same bit line sense amplifier are turned off.

To achieve the second object, there is provided a circuit for controlling an isolation gate of a semiconductor memory device comprising a plurality of latches, a plurality of block select signal drivers and a plurality of isolation gate signal generators.

The plurality of latches, corresponding to the respective memory blocks, generate latch isolation control signals 'ISOLi' set by a block select signal corresponding thereto and reset by the adjacent block select signal for a memory block to be refreshed in a self refresh mode.

The plurality of block select signal drivers corresponding to the respective memory blocks, buffer a block select signal to generate a first block driving signal, and generate a second block driving signal which is activated when the corresponding block select signal is active or the corresponding latch isolation control signal ISOLi is active.

The plurality of isolation gate control signal generators, corresponding to the respective isolation gates, receive the corresponding first block driving signal, the corresponding latch isolation control signal ISOLi and the second block driving signal corresponding to a neighboring memory block, to apply a boosted voltage VPP to the corresponding isolation gate in the case that the first block driving signal is active or the latch isolation control signal ISOLi is active, and to apply a ground voltage VSS to the same isolation gate in the case that the second block driving signal is active.

BRIEF DESCRIPTION OF THE DRAWINGS

The above objects and advantages of the present invention will become more apparent by describing in detail a preferred embodiment thereof with reference to the attached drawings in which.

DESCRIPTION OF THE PREFERRED EMBODIMENTS

As briefly discussed above, this invention operates to help eliminate bias variation at the isolation gates by controlling the isolation gate control signals so that they maintain their turned-on and turned-off states during the block refresh cycle. This invention includes a latching operation which operates during the activation of the gate control signal.

Figure 1:
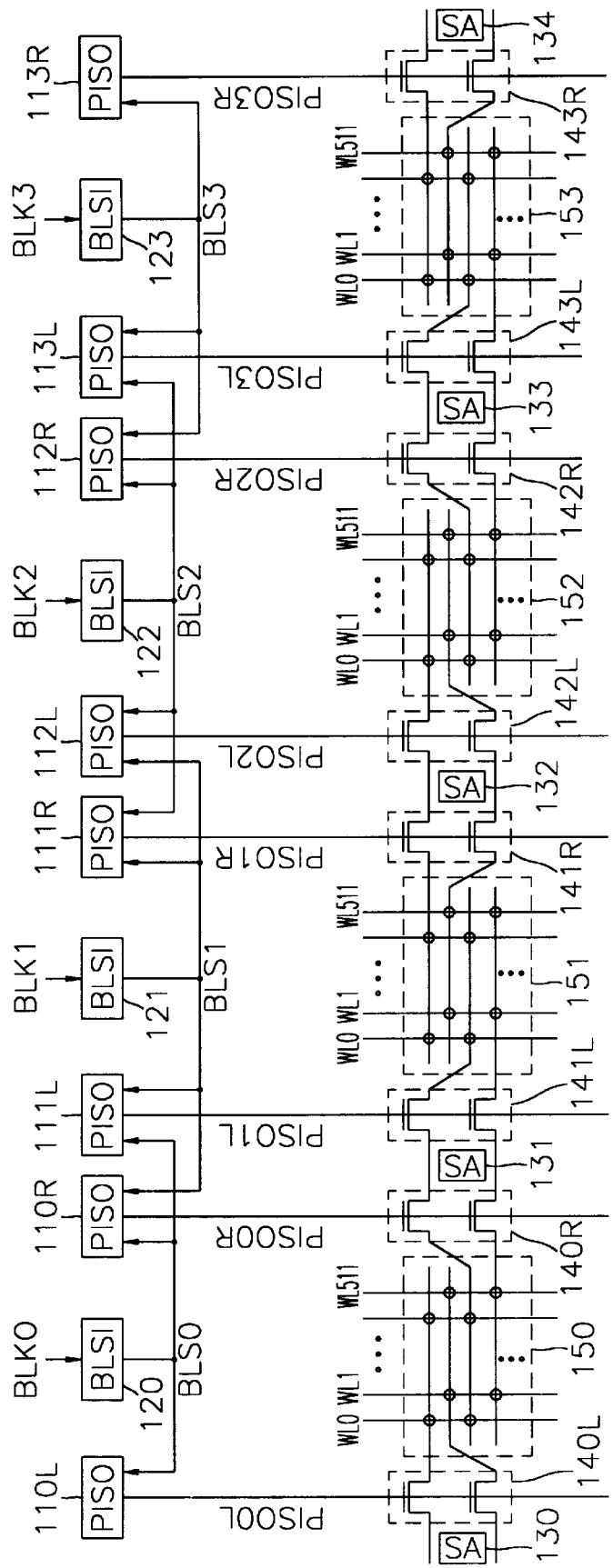
FIG. 1 shows a conventional isolation gate control circuit, and related circuits, of a semiconductor memory device.
Figure 2:
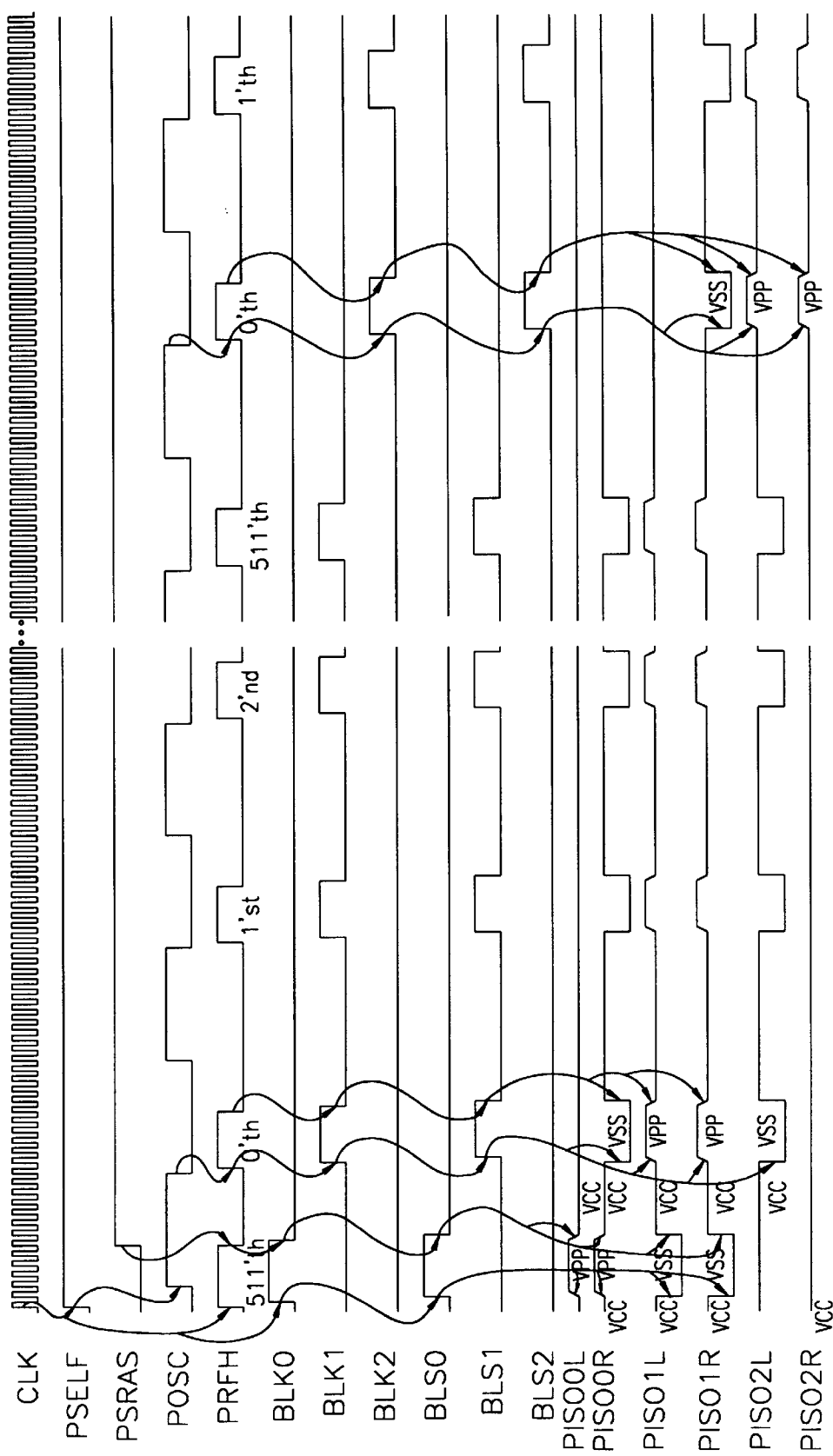
FIG. 2 shows the waveforms of signals of each portion of the isolation gate control circuit of FIG. 1.
Figure 3:
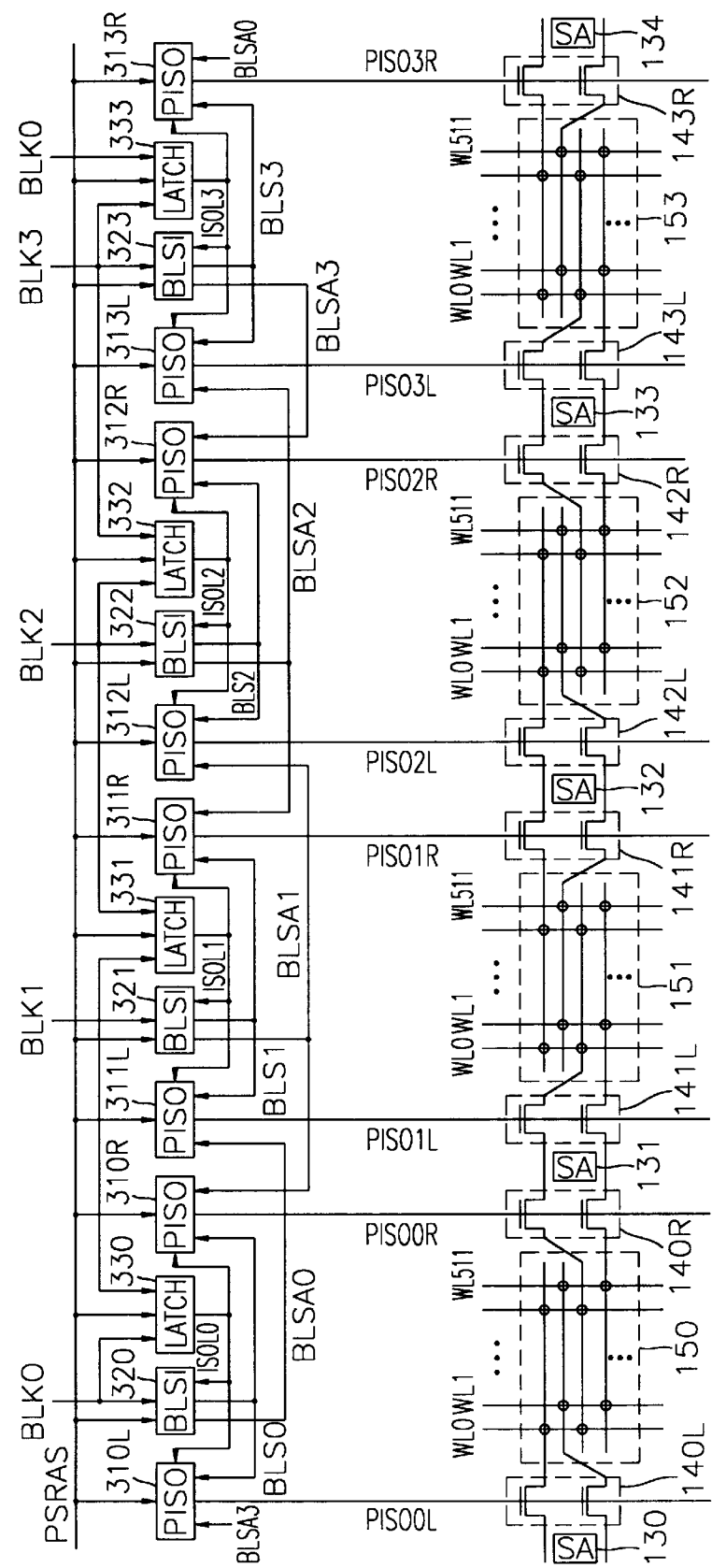
FIG. 3 shows an isolation gate control circuit according to the present invention.

Referring to FIG. 3, the isolation gate control circuit includes a plurality of isolation gate control signal generators 310L, 310R, 311L, 311R, 312L, 312R, 313L and 313R, a plurality of block select signal drivers 320, 321, 322 and 323 and a plurality of latches 330, 331, 332 and 333.

The plurality of latches 330, 331, 332 and 333 correspond respectively to memory blocks 150, 151, 152 and 153, and respectively, receive block select signals BLKi, where i indicates 0 to 3, and a self-refresh mode signal PSRAS and respectively generate latch isolation control signals ISOLi, where i indicates 0 to 3.

The latch isolation control signals ISOLi are set to a 'high' level by the corresponding block select signal in the case that the self-refresh mode signal PSRAS is active, i.e., in a self-refresh mode, and then are reset to a 'low' level by the block select signal for a memory block to be refreshed. In detail, the latch isolation control signal ISOL0 is set to a 'high' level in the case that the block select signal BLK0 is at a 'high' level, and is reset to a 'low' level in the case that the block select signal BLK1 is at a 'high' level. In other cases, the level of the latch isolation control signal ISOL0 is not changed. Also, the latch isolation control signal ISOL3 is set to a 'high' level in the case that the block select signal BLK3 is at a 'high' level, and is reset to a 'low' level in the case that the block select signal BLK0 is at a 'high' level. In other cases, the level of the latch isolation control signal ISOL3 is not changed. When the self-refresh mode signal PSRAS is at a 'low' level, i.e., in a non-self refresh mode, the block select signal BLKi corresponding to a latch isolation control signal ISOLi is at a 'high' level, and when the block select signal BLK(i+1) is at a 'low' level, the latch isolation control signal ISOLi is activated to a 'high' level.

The plurality of block select signal drivers 320, 321, 322 and 323 correspond to the memory blocks 150, 151, 152 and 153, respectively, and each receive a self-refresh mode signal PSRAS, a block select signal BLKi and a latch isolation control signal ISOLi, to generate the first and second block driving signals BLSi and BLSAi. The first block driving signal BLSi is generated by buffering the corresponding block select signal BLKi, and the second block driving signal BLSAi is activated to a 'high' level in the case that the block select signal BLKi is at a 'high' level in a self-refresh mode, or the latch isolation control signal ISOLi is at a 'high' level. In the case that the self-refresh mode signal PSRAS is at a 'low' level, the second block driving signal BLSAi is the same as the first block driving signal BLSi. The first block driving signal BLSi, which is a signal indicating turn-on information, is applied to the isolation gate control signal generators of the corresponding memory block, and the second block driving signal BLSAi, which represents turn-off information, is applied to the neighboring isolation gate control signal generators to the isolation gate control signal generators of the corresponding memory block. For example, the first block driving signal BLS1 is applied to the isolation gate control signal generators 311L and 311R, and the second block driving signal BLSA1 is applied to the isolation gate control signal generators 310R and 312L.

That is, the second block driving signal BLSAi, used as the turn-off information, is generated by using the latch isolation control signal ISOLi, so that the level of the second block driving signal BLSAi can be constantly held during refresh operation of a same block to avoid voltage variation of isolation control gate.

The plurality of isolation gate control signal generators 310L, 310R, 311L, 311R, 312L, 312R, 313L and 313R correspond to isolation gates 140L, 140R, 141L, 141R, 142L, 142R, 143L and 143R, respectively, and receive the first block driving signal BLSi, the latch isolation control signal ISOLi, and also receive the second block driving signal BLSAi of a neighboring memory block, hereinafter, the second connected to the same bit line sense amplifier is BLSAj) to generate an isolation gate control signal PISOi. In the case that the first block driving signal BLSi is active or a latch isolation control signal ISOLi is active, the isolation gate control signal generator generates an isolation gate control signal PISOi of a boosted voltage VPP. In the case that the second block driving signal BLSAj is active, the isolation gate control signal generator generates an isolation gate control signal PISOi of a ground voltage. In the other cases, the isolation gate control signal generator generates an isolation gate control signal PISOi of a power supply voltage VCC. Also, in the case that the latch isolation control signal ISOLi, as well as the first block driving signal BLSi received as turn-on information, are active, the isolation gate control signal PISOi has a boosted voltage VPP. Accordingly, the isolation gate control signal PISOi is held at the boosted voltage VPP during a refresh operation on the corresponding memory block in accordance with this invention.

Figure 4:
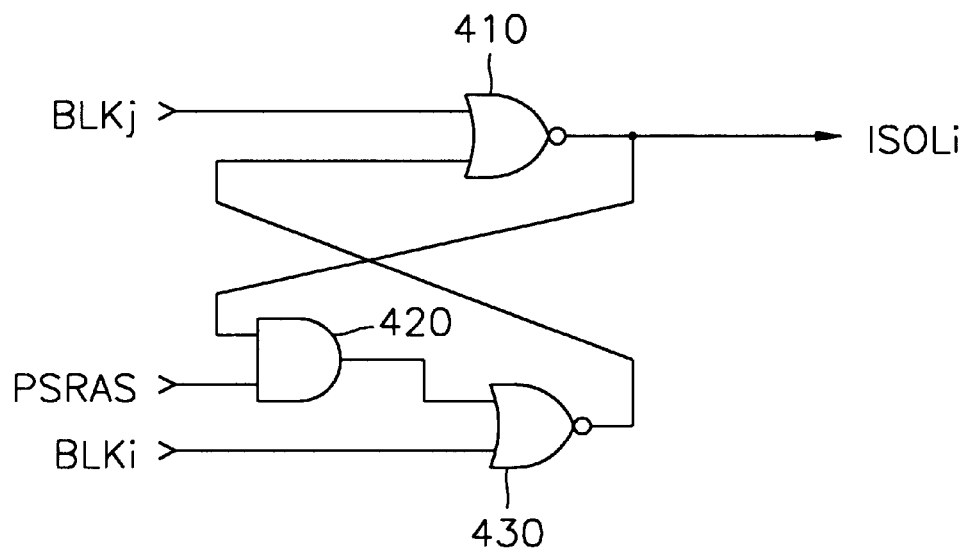
FIG. 4 shows an embodiment of latches 330, 331, 332 and 333 of FIG. 3.

Referring to FIG. 4, each of latches 330, 331, 332 and 333 includes NOR gates 410, 430 and an AND gate 420. The AND gate 420 AND-operates a self-refresh mode signal PSRAS and the output of the NOR gate 410. The NOR gate 430 NOR-operates the block select signal BLKi and the output of the AND gate 420. The NOR gate 410 NOR-operates the block select signal BLKj and the output of the NOR-gate 430 to generate a latch isolation control signal ISOLi. Accordingly, the latch isolation control signal ISOLi is set to a 'high' level according to the block select signal BLKi, when the self-refresh mode signal PSRAS is activated to a 'high' level, and then reset to a 'low' level according to the block select signal BLKj. When the self-refresh mode signal PSRAS is inactive, at a 'low' level, the latch isolation control signal ISOLi is activated to a 'high' level, in the case that the block select signal BLKi is at a 'high' level and the block select signal BLKj is at a 'low' level. Accordingly, the latch isolation control signal ISOLi is held at a 'high' level during a self-refresh operation of the same block.

The latch isolation control signal ISOLi, as shown in FIG. 3, is applied to the block select signal driver and the isolation gate control signal generators.

Figure 5:
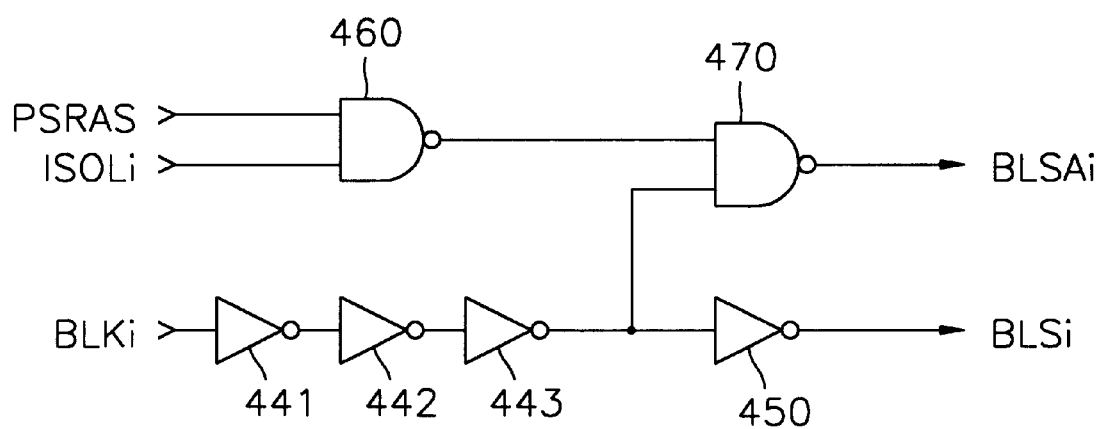
FIG. 5 shows an embodiment of block select signal drivers 320, 321, 323 and 324 of FIG. 3.

FIG. 5 shows an embodiment of the block select signal drivers 320, 321, 322 and 323 of FIG. 3.

Referring to FIG. 5, each of the block select signal drivers includes NAND gates 460 and 470 and inverters 441, 442, 443 and 450. The NAND gate 460 NAND-operates the self-refresh mode signal PSRAS and the latch isolation control signal ISOLi. The inverters 441, 442 and 443 buffer and invert the block select signal BLKi. The NAND gate 470 NAND-operates the output of the NAND gate 460 and the output of the inverter 443, to generate the second block driving signal BLSAi, where BLSAi indicates one of BLSA0 to BLSA3. The inverter 450 inverts the output of the inverter 443 to generate the first block driving signal BLSi.

The first block driving signal BLSi is generated by buffering the block select signal BLKi by the inverters 441, 442, 443 and 450, and the phase thereof is changed, with reference to the block select signal BLKi, regardless of the self refresh mode signal PSRAS.

The second block driving signal BLSAi is activated to a 'high' level when the self-refresh mode signal PSRAS is at a 'high' level, and at the same time, the block select signal BLKi corresponding thereto is at a 'high' level or the latch isolation control signal ISOLi is at a 'high' level. Meanwhile, when the self-refresh mode signal PSRAS is at a 'low' level, the second block driving signal BLSAi is generated by buffering the block select signal BLKi. Accordingly, the phase of the second block driving signal BLSAi is changed, with reference to the block select signal BLKi.

Figure 6:
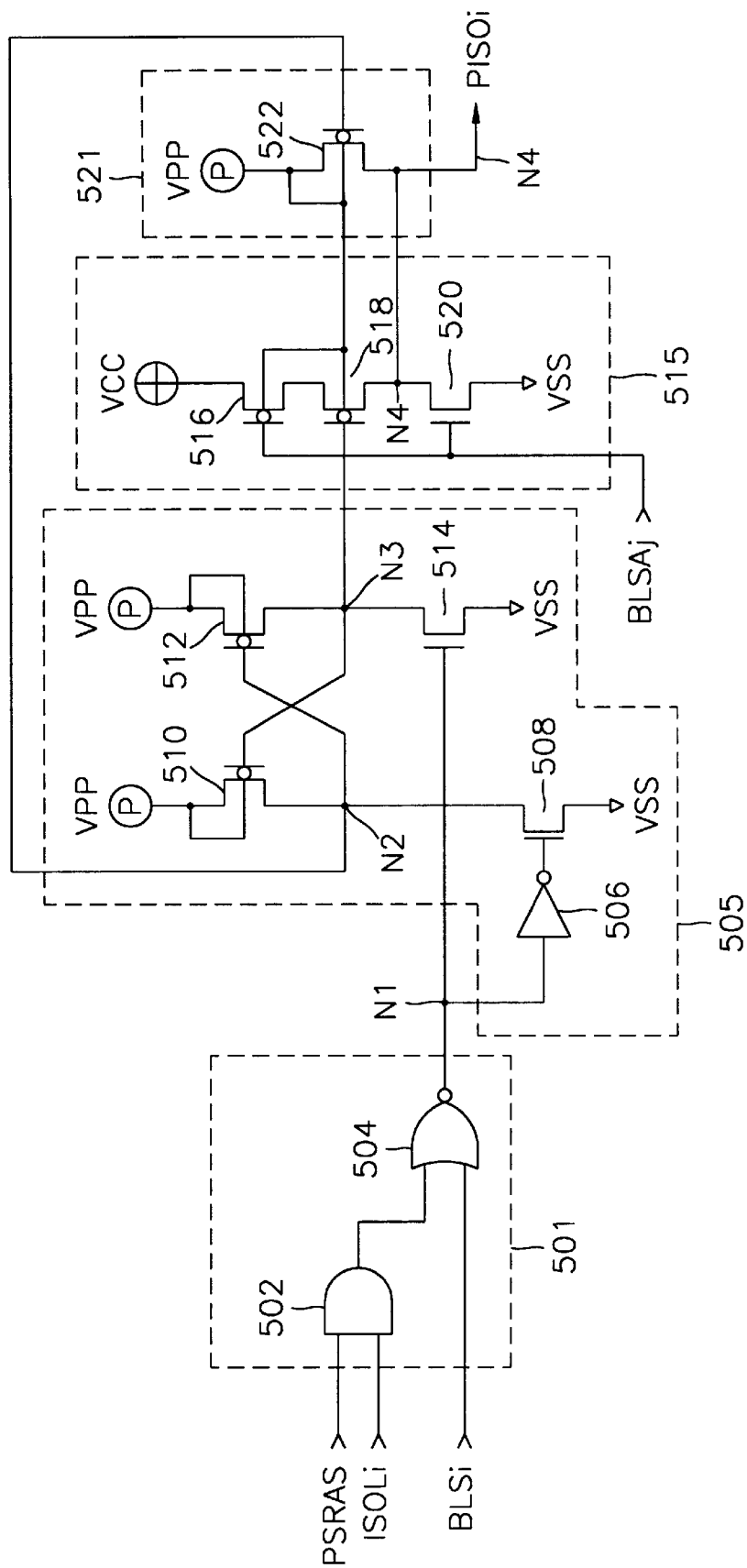
FIG. 6 shows an embodiment of the isolation gate control signal generators 310L, 310R, 311L, 311R, 312L, 312R, 313L, and 313R.

FIG. 6 shows an embodiment of the isolation gate control signal generators 310L, 310R, 311L, 311R, 312L, 312R, 313L, and 313R of FIG. 3.

In FIG. 6, each of the isolation gate control signal generators includes a logic portion 501, a level transition unit 505, an inverter 515 and a switching portion 521.

When in a self-refresh mode, and either the latch isolation control signal ISOLi or the first block driving signal BLSi is active, the output of the logic portion 501 has a 'low' level.

When the output of the logic portion 501 is at a 'high' level, the inverter 515 is activated, and inverts the adjacent block to generate an isolation gate control signal PISOi.

When the output of the logic portion 501 is at a 'low' level, the switching portion 521 is turned on to generate a boosted voltage as an isolation gate control signal PISOi.

The level transition portion 505 generates a boosted voltage VPP and a ground voltage VSS according to the output of the logic portion 501. Here, when the output of the logic portion 501 is at a 'low' level, the boosted voltage VPP is applied to the inverter 515 and the ground voltage VSS is applied to the switching portion 521. Also, when the output of the logic portion 501 is at a 'high' level, the boosted voltage VPP is applied to the switching portion 521 and the ground voltage VSS is applied to the inverter 515.

In detail, the logic portion 501 includes an AND gate 502 and a NOR gate 504. The AND gate 502 AND-operates the self-refresh mode signal PSRAS and the latch isolation control signal ISOLi. The NOR gate 504 NOR-operates the output of the AND gate 502 and the first block driving signal BLSi. Accordingly, in the case that the self-refresh mode signal PSRAS is a logic 'high' level, a node N1 is at a 'low' level when the latch isolation control signal ISOLi is at a 'high' level or the first block driving signal BLSi is at a 'high' level. In the case that the self-refresh mode signal PSRAS is at a 'low' level, the signal of the node N1 is the inversion of the first block driving signal BLSi.

The level transition portion 505 includes an inverter 506, NMOS transistors 508 and 514 and PMOS transistors 510 and 512. The inverter 506 inverts the signal of the node N1. The NMOS transistor 508, the drain/source path of which is connected between a node N2 and the ground voltage VSS, determines gating according to an output state of the inverter 506. The NMOS transistor 514 has the drain/source path connected between a node N3 and the ground voltage VSS, and the gate connected to the node N1. The PMOS transistor 510 has the drain/source path connected between the boosted voltage VPP and the node N2, the gate connected to the node N3, and a bulk connected to a source. The PMOS transistor 512 has the drain/source path connected between the boosted voltage VPP and the node N3, the gate connected to the node N2, and a bulk connected to a source.

When the node N1 is at a 'low' level, the NMOS transistor 514 is turned off and the NMOS transistor 508 is turned on. When the NMOS transistor 508 is turned on, the node N2 is at the ground voltage VSS and the PMOS transistor 512 is turned on. Accordingly, the node N3 reaches a boosted voltage VPP, and the PMOS transistor 510 is held off.

Meanwhile, when the node N1 is a 'high' level, the NMOS transistor 508 is turned off, and the NMOS transistor 514 is turned on. When the NMOS transistor 514 is turned on, the node N3 is the ground voltage VSS and the PMOS transistor 510 is turned on. Thus, the node N2 is at a boosted voltage VPP and the PMOS transistor 512 is turned off.

The signal at the node N2 is applied to the switching portion 521, and the signal at the node N3 is applied to the inverter 515.

The inverter 515 includes PMOS transistors 516 and 518 and an NMOS transistor 520. The second block driving signal BLSAj is applied to the gate of the PMOS transistor 516 and the gate of the NMOS transistor 520, and the gate of the PMOS transistor 518 is connected to the node N3. The drain/source paths of the PMOS transistors 516 and 518 and the NMOS transistor 520 are connected in series between the power supply voltage VCC and the ground voltage VSS. The bulks of the PMOS transistors 516 and 518 are connected to the boosted voltage VPP, and the drain of the NMOS transistor 520 is connected to an output node N4. The inverter 515, which is enabled when the node N3 is at a 'low' level, inverts a second block driving signal BLSAj to generate an isolation gate control signal PISOi at the node N4.

The switching portion 521 includes a PMOS transistor 522 having the source connected to the boosted voltage VPP, the gate connected to the node N2, and the drain connected to the output node N4. The PMOS transistor 522 is turned on when the node N2 is at a 'low' level, to boost the output node N4 to the boosted voltage VPP. The isolation gate control signal PISOi is generated through the output node N4.

Accordingly, when the node N1 is at a 'high' level, the switching portion 521 is turned off, and the inverter 515 is activated to invert the second block signal BLSAj, to thereby generate the isolation gate control signal PISOi. Also, when the node N1 is at a 'low' level, the inverter 515 is not activated, and the PMOS transistor 522 is turned on to take the isolation gate control signal PISOi to the boosted voltage VPP. When the self-refresh mode signal PSRAS is at a 'high' level, and at the same time either the latch isolation control signal 'ISOLi' or the first block driving signal BLSi is at a 'high' level, the node N1 is at a 'low' level. That is, in the self-refresh mode, the node N1 is held at a 'low' level during a refresh operation on the same block, which causes the isolation gate control signal PISOi to reach the boosted voltage.

Meanwhile, in the case that the node N1 is at a 'high' level and then the inverter 515 is activated, and at the same time the second block driving signal BLSAj is at a 'high' level, the isolation gate control signal PISOi is at a ground voltage, and in the case that the second block driving signal BLSAj is at a 'low' level, the isolation gate control signal PISOi is at a power supply voltage VCC.

Figure 7:
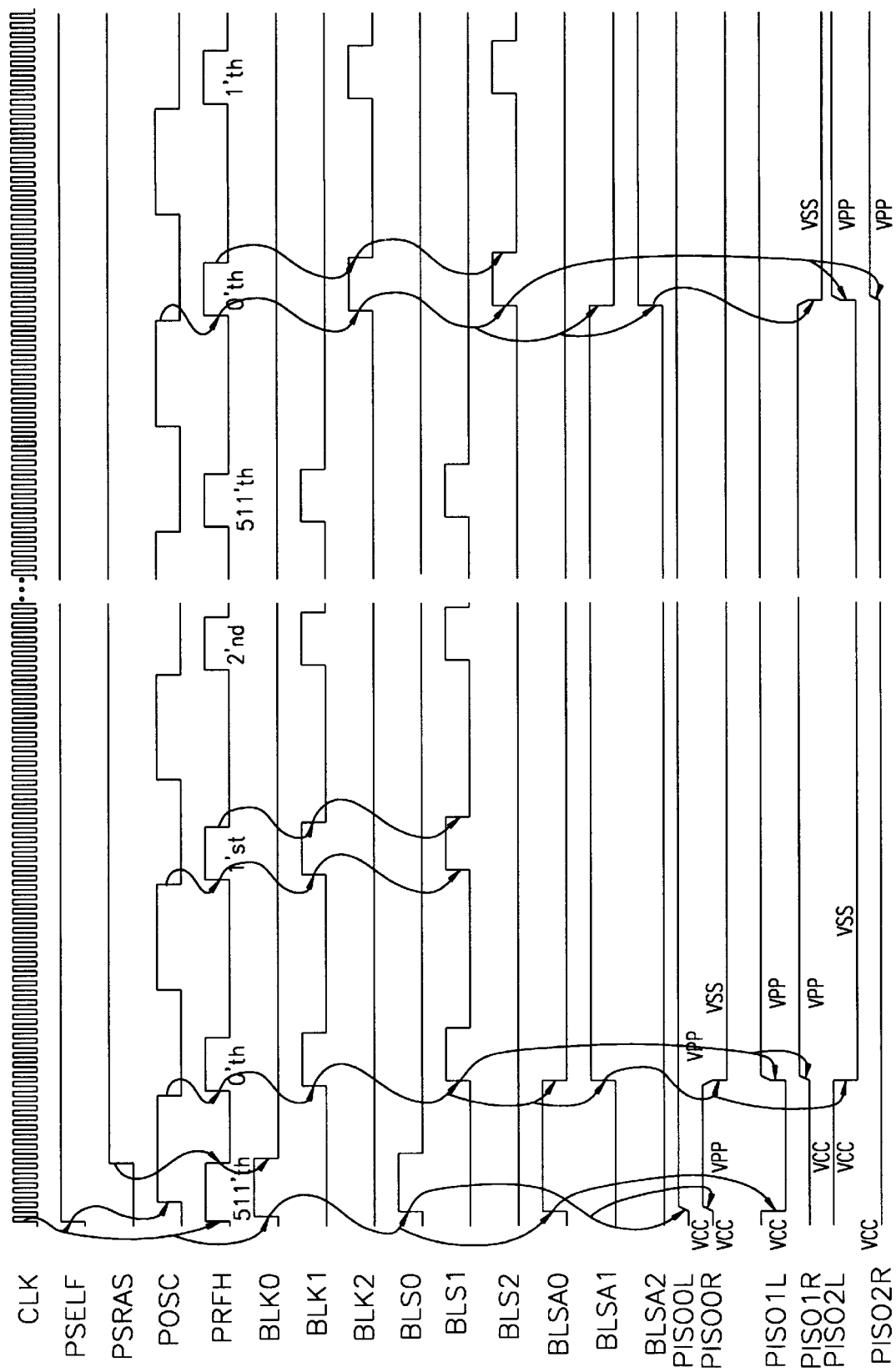
FIG. 7 shows the waveform of each signal produced by the method for controlling an isolation gate according to the present invention.

FIG. 7 shows signal waveforms during the control of an isolation gate according to the present invention.

Referring to FIG. 7, when a self-refresh order is externally received, a self-refresh set signal PSELF is activated to a 'high' level. The self-refresh set signal PSELF is generated regardless of the inner state of the semiconductor memory device. When the self-refresh set signal PSELF is activated, an output signal POSC of an oscillator is activated, and at the same time, a self-refresh operation is performed. Also, when the falling edge of a refresh row active signal PRFH appears after the self-refresh set signal PSELF is active to a 'high' level, the self-refresh mode signal PSRAS is activated to a 'high' level.

The refresh row active signal PRFH, being an auto pulse having a fixed pulse period, is activated every predetermined number of clock signal CLK in the case that the self-refresh mode signal PSRAS is at a 'low' level, and is activated at the falling edge of the output signal POSC in the case that the self-refresh mode signal PSRAS is at a 'high' level. Accordingly, the refresh row active signal PRFH is activated for a constant period.

The block select signals BLK0, BLK1, BLK2, . . . are selectively activated according to a refresh address scheme, where the active period of the block select signals depends on that of the refresh row active signal PRFH.

A plurality of latch isolation control signals ISOLi are generated in response to the block select signals. The latch isolation control signal 'ISOLi' is set by the corresponding block select signal, and then reset by the block select signal for a memory block to be refreshed.

A second block driving signal BLSAi is generated in response to the above latch isolation control signal ISOLi. Also, the latch isolation control signal ISOLi as well as the first block driving signal BLSi are used for turn-on information for an isolation gate. That is, when the latch isolation control signal ISOLi is active, the corresponding isolation gates are turned on, and the other isolation gates connected to the same bit line sense amplifier are turned off.

In FIG. 7, the first block driving signals BLS1, BLS2, BLS3, . . . are generated by buffering the block select signals. However, the second block driving signals BLSA0, BLSA1, BLSA2, . . . are generated according to the block select signal and the latch isolation control signal. In detail, when the self-refresh mode signal PSRAS is at a 'low' level, the second block driving signals BLSA0, BLSA1, BLSA2, . . . on a level of the block select signal as well as the first block driving signal BLSi. However, when the self-refresh mode signal PSRAS is at a 'high' level, the second block driving signal BLSAi is held at a 'high' level during the period of a refresh operation of the corresponding memory block.

The isolation gate control signals PISOi, where i indicates 0L, 0R, 1L, 1R, . . . , are activated to a boosted voltage VPP according to the latch isolation control signal ISOLi and the first block driving signal BLSi, and are deactivated to a ground voltage VSS according to the second block driving signal BLSAj.

Accordingly, when the self-refresh mode signal PSRAS is at a 'high' level, and at the same time the first block driving signal BLSi is active or the latch isolation control signal ISOLi is active, the isolation gate control signal PISOi rises to a boosted voltage VPP. When the second block driving signal, related to the other isolation gate connected to the same bit line sense amplifier, is active, the isolation gate control signal PISOi drops to a ground voltage VSS. In other cases except the above cases, the isolation gate control signal PISOi is at a power supply voltage VCC.

As described above, in the method for controlling an isolation gate of a semiconductor memory device and the circuit therefor, the levels of the isolation gate control signals are not unnecessarily changed during a block refresh period in the self-refresh or the auto refresh mode, to thereby reduce power consumption.

It should be understood that the invention is not limited to the illustrated embodiment and that many changes and modifications can be made within the scope of the invention by a person skilled in the art.

We claim:

1. A method for controlling isolation gates of a semiconductor memory device in a self refresh mode, the memory device including a plurality of memory blocks, a plurality of shared bit line sense amplifiers, and a plurality of isolation gates connected respectively between the memory blocks and the shared bit line sense amplifiers, the method comprising:

a) generating a refresh row active signal (PRFH) which is activated during a predetermined period;

b) generating a plurality of block select signals (BLKi) selectively activated when the refresh row active signal (PRFH) is active where index i changes from zero to an ith memory block;

c) generating a plurality of latch isolation control signals (ISOLi), each latch isolation control signal being set by a corresponding block select signal (BLKi) reset by a block select signal (BLKj) corresponding to a neighboring block, and applied to a particular memory block to be refreshed where index j references a memory block neighboring the ith memory block; and d) controlling the isolation gates such that at least one isolation gate is turned on to a turned-on state and other isolation gates connected to the same bit line sense amplifier are turned off to a turned-off state, in a manner which substantially constantly holds the turned-on and turned-off states of the isolation gates during a refresh operation of a same block.

2. The method for controlling the isolation gates of the semiconductor memory device of claim 1, step d) comprising:

buffering the plurality of block select signals (BLKi) to generate a plurality of respective first block driving signals (BLSi);

generating a plurality of second block driving signals (BLSAi), each second block driving signal being activated when the corresponding block select signal (BLKi) is active or the corresponding latch isolation control signal (ISOLi) is active;

applying a boosted voltage to the isolation gates when the first block driving signal is active or the latch isolation control signal (ISOLi) is active;

applying a ground voltage (VSS) to the isolation gates when the second block driving signal, related to the other isolation gates connected to the same bit line sense amplifier, is active; and applying a power supply voltage (VCC) to the isolation gates when the block select signal is changed.

3. An isolation gate control circuit for a semiconductor memory device including a plurality of memory blocks, a plurality of common bit line sense amplifiers, and a plurality of isolation gates connected respectively between the memory blocks and the common bit line sense amplifiers, comprising:

a plurality of latches corresponding to the plurality of memory blocks for generating a plurality of latch isolation control signals, each latch isolation control signal (ISOLi) being set by a corresponding block select signal (BLKi) in a self refresh mode and reset by a corresponding block select signal BLKj, where index i references a memory block i and index j references a neighboring memory block;

a plurality of block select signal drivers corresponding to the memory blocks for generating a plurality of first block driving signals and a plurality of second block driving signals, each first block driving signal (BLSi) being generated by buffering the block select signal and each second block driving signal (BLSAi) being activated in the case that the block select signal (BLKi) is active or the latch isolation control signal (ISOLi) is active in a self refresh mode; and a plurality of isolation gate control signal generators corresponding to the isolation gates for receiving a first block driving signal (BLSi) and a second block driving signal (BLSAj) and the latch isolation control signal (ISOLi) and applying a boosted voltage (VPP) to the isolation gate in the case that the first block driving signal is active or the latch isolation control signal is active, and to apply a ground voltage (VSS) to the isolation gate in the case that the second block driving signal BLSAj is active;

wherein turned-on and turned-off states of the isolation gates are substantially constantly held during a same block refresh cycle.

4. An isolation gate control circuit for a semiconductor memory device including a plurality of memory blocks, a plurality of common bit line sense amplifiers, and a plurality of isolation gates connected respectively between the memory blocks and the common bit line sense amplifiers, comprising:

a plurality of latches corresponding to the plurality of memory blocks for generating a plurality of latch isolation control signals, each latch isolation control signal (ISOLi) being set by a corresponding block select signal (BLKi) in a self refresh mode and reset by a corresponding block select signal (BLKj), where index i references a memory block i and index j references a neighboring memory block and where each latch includes:
  a first NOR gate 410 for NOR-operating the block select signal of a refreshed memory block and another signal to generate the latch isolation control signal (ISOLi); and
  a second NOR gate 430 for NOR-operating the output of the first NOR gate and the block select signal to generate the another signal;

a plurality of block select signal drivers corresponding to the memory blocks for generating a plurality of first block driving signals and a plurality of second block driving signals, each first block driving signal (BLSi) being generated by buffering the block select signal and each second block driving signal (BLSAi) being activated in the case that the block select signal (BLKi) is active or the latch isolation control signal (ISOLi) is active in a self refresh mode; and a plurality of isolation gate control signal generators corresponding to the isolation gates for receiving a first block driving signal (BLSi) and a second block driving signal (BLSAi) corresponding to the latch isolation control signal (ISOLi) and applying a boosted voltage (VPP) to the isolation gate in the case that the first block driving signal is active or the latch isolation control signal is active, and to apply a ground voltage (VSS) to the isolation gate in the case that the second block driving signal is active;

wherein turned-on and turned-off states of the isolation gates are substantially constantly held during a block refresh cycle.

5. The isolation gate control circuit of the semiconductor memory device of claim 4, wherein the plurality of latches further include an AND gate for AND-operating a self refresh mode signal (PSRAS) and the output of the first NOR gate to apply the result to the second NOR gate.

6. The isolation gate control circuit of the semiconductor memory device of claim 3, each of the plurality of block select signal drivers comprising:
  inverter chain for buffering the block select signal to generate the first block driving signal (BLSi);
  a first NAND gate for NAND-operating the self refresh mode signal (PSRAS) and the latch isolation control signal (ISOLi); and
  a second NAND gate for NAND operating an inversion signal of the block select signal and the output of the first NAND gate, to generate the second block driving signal (BLSAi).

7. The isolation gate control circuit of the semiconductor memory device of claim 3, each of the plurality of isolation gate control signal generator further comprising:
  a logic portion having the output of a 'low' level when at least one signal of the latch isolation control signal (ISOLi) or the first block driving signal are active;
  an inverter activated when the output of the logic portion is at a 'high' level, for inverting the second block driving signal corresponding to the neighboring memory block, to generate an isolation gate control signal (PISOi) applied to the isolation gate; and
  a switching portion for generating a boosted voltage (VPP) as the isolation gate control signal (PISOi), turned on when the output of the logic portion is a 'low' level.

8. The isolation gate control circuit of the semiconductor memory device of claim 7, each of the plurality of isolation gate control signal generators changing the output of the isolation control signal to the boosted voltage or the ground voltage, comprising a level changing portion for applying a boosted voltage VPP to the inverter and a ground voltage VSS to the switching portion, when the output of the logic portion is at a 'low' level, and for applying the boosted voltage VPP to the switching portion and the ground voltage VSS to the inverter when the output of the logic portion is at a 'high' level.

9. The isolation gate control circuit of the semiconductor memory device of claim 8, the level transition portion comprising:
  a first inverter for inverting the output of the logic portion;
  a first NMOS transistor having a grounded source and a gate connected to the output terminal of the first inverter;
  a second NMOS transistor having a grounded source and a gate connected to the output of the logic portion;
  a first PMOS transistor having a source/drain path connected between the boosted voltage (VPP) and a drain of the first NMOS transistor, a gate connected to a drain of the second NMOS transistor, and a bulk connected to the source of the first PMOS transistor; and
  a second PMOS transistor having a drain/source path connected between the boosted voltage (VPP) and the drain of the second NMOS transistor, a gate connected to the drain of the first NMOS transistor and a bulk connected to the source of the second PMOS transistor,
  wherein the drain of the first NMOS transistor is connected to the switching portion, and the drain of the second NMOS transistor is connected to the inverter.

10. The isolation gate control circuit of the semiconductor memory device of claim 7, the inverter comprising:

a first PMOS transistor, turned on when the output of the logic portion is a 'high' level;

a second PMOS transistor having a drain/source path connected to a power supply voltage (VCC) and the source of the first PMOS transistor and a bulk connected to the bulk of the first PMOS transistor and a gate connected to the second block driving signal; and an NMOS transistor having a drain/source path connected between the drain of the first PMOS transistor and a ground voltage (VSS) and a gate connected to the second block driving signal, and for generating the isolation gate control signal PISOi from the drain.

11. The isolation gate control circuit of the semiconductor memory device of claim 7, the switching portion comprising a PMOS transistor turned on when the output of the logic portion is a 'low' level, of which the source and the bulk are connected to a boosted voltage VPP and the drain is connected to the output of the inverter, to generate the isolation gate control signal from the drain.

12. A method for controlling isolation gates of a semiconductor memory device in a self refresh mode, the memory device including a plurality of memory blocks, a plurality of shared bit line sense amplifiers, and a plurality of isolation gates connected respectively between the memory blocks and the shared bit line sense amplifiers, the method comprising:

generating a plurality of latch isolation control signals for application to particular ones of the plurality of memory blocks to be refreshed, each latch isolation control signal (ISOLi) being set by a corresponding block select signal (BLKi) in a self refresh mode and reset by a corresponding block select signal (BLKj), where index i references a memory block i and index j references a neighboring memory block;

controlling the isolation gates so that at least one isolation gate is turned on and other isolation gates connected to the same bit line sense amplifier are turned off in a manner which substantially constantly holds the turned-on and turned-off states of the isolation gates during a refresh operation of a same block.

* * * * *